United States Patent [19]

Masumori

[11] Patent Number: 5,450,016
[45] Date of Patent: Sep. 12, 1995

[54] METHOD OF QUICKLY EVALUATING CONTACT RESISTANCE OF SEMICONDUCTOR DEVICE

[75] Inventor: Katsuhiro Masumori, Tokyo, Japan

[73] Assignee: NEC Corporation, Tokyo, Japan

[21] Appl. No.: 266,574

[22] Filed: Jun. 28, 1994

[30] Foreign Application Priority Data

Jun. 30, 1993 [JP] Japan ................. 5-186843

[51] Int. Cl.⁶ ............... G01R 27/08; G01R 31/26
[52] U.S. Cl. ....................... 324/713; 324/719; 324/73.1
[58] Field of Search ............ 324/691, 713, 715, 719, 324/73.1

[56] References Cited

U.S. PATENT DOCUMENTS

| | | | |
|---|---|---|---|
| 4,628,144 | 12/1986 | Burger | 324/719 X |
| 4,672,314 | 6/1987 | Kokkas | 324/719 X |
| 4,896,108 | 1/1990 | Lynch et al. | 324/713 X |
| 5,239,270 | 8/1993 | Desbiens | 324/719 |
| 5,293,133 | 3/1994 | Birkner et al. | 324/713 |

FOREIGN PATENT DOCUMENTS 61-61537  9/1981  Japan.
2-90642   3/1990  Japan.
4-250647  9/1992  Japan.

Primary Examiner—Kenneth A. Wieder
Assistant Examiner—Glenn W. Brown
Attorney, Agent, or Firm—Sughrue, Mion, Zinn, Macpeak & Seas

[57] ABSTRACT

A large number of evaluating cells are arranged in a semiconductor chip, and each of the evaluating cells is implemented by first, second and third impurity regions, a first gate electrode formed over a channel between the first and second impurity regions and a second gate electrode formed over a channel between the first and third impurity regions, wherein current is sequentially supplied to the evaluating cells so that current flows from the first impurity region to the second impurity region; however, no current flows through the third impurity region, and a potential difference between the first and third impurity regions is reported as a contact resistance at the first impurity region.

7 Claims, 7 Drawing Sheets

METHOD OF QUICKLY EVALUATING CONTACT RESISTANCE OF SEMICONDUCTOR DEVICE

FIELD OF THE INVENTION

This invention relates to a method for evaluating contact resistances of a semiconductor device and, more particularly, a method of sequentially evaluating contact resistances incorporated in a semiconductor device.

DESCRIPTION OF THE RELATED ART

Various contacts between a semiconductor layer and a metal layer and between semiconductor layers are incorporated in the semiconductor integrated circuit device, and the circuit components are electrically connected through these contacts. A contact is resistive against an electric signal passing therethrough, and the contact resistances have influences on the circuit characteristics of the integrated circuit. For this reason, a circuit designer requests a process designer to regulate the contact resistance around a target value, and the manufacturer checks the contact resistances to see whether or not the contact resistance falls within the target range for evaluating the process parameters.

FIG. 1 illustrates a dynamic random access memory cell as a typical example of circuit components of the large scale integration. The dynamic random access memory device is fabricated on a silicon substrate 1, and a thick field oxide layer 2 defines an active area assigned to two dynamic random access memory cells 3 and 4.

The dynamic random access memory cell 3 is implemented by a series of a switching transistor 3a and a stacked type storage capacitor 3b. A switching transistor 4a and a stacked type storage capacitor 4b, coupled in series, form the other dynamic random access memory cell 4. A drain region 34a is shared between the switching transistors 3a and 4a, and each of the switching transistors 3a and 4a has a gate electrode 3c/4c and a source region 3d/4d. On the other hand, each of the storage capacitors 3b and 4b is constituted by an accumulation electrode 3e/4e, a dielectric film 3f/4f and a shared counter electrode 34b. An inter-level insulating film structure 34c provides appropriate electrical isolation between the regions and electrodes, and a bit line 34d passes through a contact hole formed in the inter-level insulating film structure for contacting with the common drain region 34a. A passivation film 34e covers the bit line 34d, and a data bit is transferred between the accumulating electrode 3e/4e and the bit line 34d through the switching transistor 3a/4a.

Thus, the first contact between the accumulating electrode 3e/4e and the source region 3d/4d is incorporated in every dynamic random access memory cell ¾, and the second contact between the bit line 34d and the common drain region 34a is required for every two dynamic random access memory cells 3 and 4. If the dynamic random access memory device is of the 4 mega-bit type, $4.1 \times 10^6$ first contacts and $2.0 \times 10^6$ second contacts are incorporated therein. The channel resistance of each switching transistor 3a/4a in the on-state is designed to be 10 kilo-ohms, and the first and second contacts are targeted for 1 kilo-ohms. Even though the fabrication process is fluctuated, each of the first and second contacts is expected to fall within the relative error at 100%, and the products with the first or second contact over the maximum relative error are rejected before delivery from the fabrication factory, because such a large contact resistance is causative of a write-in error and/or read-out error. For this reason, it is necessary for the manufacturer to monitor the first and second contact resistances.

FIGS. 2 and 3 illustrate a prior art structure available for the evaluation of a contact resistance, and the prior art evaluation structure is disclosed in Japanese Patent Publication of Unexamined Application No. 63-33665. A semiconductor substrate 5 is partially covered with a thick field oxide layer 6, and an impurity region 7 is exposed to a generally L-shaped opening in the thick field oxide layer 6. Though not shown in FIG. 2, an inter-level insulating layer 8 covers the impurity region 7, and contact holes 8a, 8b and 8c are formed in the inter-level insulating layer 8. Three electrodes 9a, 9b and 9c are formed on the inter-level insulating layer 8, and are held in contact with the impurity regions 7 at intervals.

Using the evaluation structure shown in FIGS. 2 and 3, the contact resistance is measured as follows. A current source (not shown) is connected between the electrodes 9b and 9c, and a voltage meter is connected between the electrodes 9a and 9b. Current I flows between the electrodes 9b and 9c, and potential difference V is measured between the electrodes 9a and 9b. The contact resistance R at 8b is given as $R = V/I$.

Another prior art structure available for the evaluation for the contact resistance is illustrated in FIG. 4, and has a plurality of impurity regions 10a, 10b, 10c, ... and 10n isolated from one another by a thick field oxide layer 11 grown on a semiconductor substrate 12. The semiconductor substrate 12 is covered with an insulating layer 13, and contact holes 13a, 13b, 13c, ... and 13n are formed in the insulating layer 13. A pair of electrodes 14a/14b and interconnections 14c are patterned on the insulating layer 13. The electrodes 14a and 14b are held in contact with the impurity regions 10a and 10n through the contact holes 13a and 13n, respectively, and the interconnections 14c are connected between adjacent two impurity regions 10a/10b, 10b/10c, ... and $10n-1/10n$ through the associated contact holes 13a/13b, 13b/13c, ... and $13n-1/13n$. As a result, the impurity regions 10a to 10n are sequentially connected through the interconnections 14c.

In the evaluation, a potential V is applied between the electrodes 14a and 14b, and cause current I to flow between the electrodes 14a and 14b. The current I is measured, and the quotient is calculated from the current I and the potential V. The quotient is representative of the total of the contact resistances, the resistances of the impurity regions 10a to 10n and the resistances of the interconnections 14c.

If the evaluation structure shown in FIG. 4 has 2N contacts, the impurity regions are N, and the interconnections are $N-1$. The resistances at 2N contacts are given by subtracting the resistances of the impurity regions and the interconnections from the total resistance or the quotient, and the difference is averaged to determine a single contact resistance. The resistances of the impurity regions 10a to 10n and the resistances of the interconnections 14c are estimated values.

If at least one defective contact is incorporated in the evaluation structure, the defective contact decreases the amount of current I, and, accordingly, the total resistance at the contacts 2N are increased.

The first prior art evaluation structure allows an analyst to evaluate only one contact through a single evaluation. This means that the first prior art evaluation structure is merely available for a semiconductor integrated circuit device with a small number of contacts. In order to analyze influences of the dispersion of contact resistances on the production yield of an ultra-large scale integration such as the 4 mega-bit dynamic random access memory device, $6.2 \times 10^6$ sets of contact holes $8a/8b/8c$ are required together with $6.2 \times 10^6$ L-shaped impurity regions, and such a large number of L-shaped impurity regions prolongs the evaluation. If the contact holes are decreased, the evaluation is less reliable.

On the other hand, the second prior art evaluation structure allows an analyst to evaluate all of the contacts through a single evaluation, and is not time-consuming. However, the contact resistance is give as an average of the 2N contact resistances, and the analyst hardly analyzes a dispersion of the contact resistances. Moreover, if the number N of contact holes is increased, the current I becomes close to the minimum measurable value, and the accuracy is lowered. If the prior art evaluation structure has $10^6$ contacts each having a resistance of 1 kilo-ohm, the current I is only 1 nano-ampere under the potential of 1 volt. Therefore, the second prior art evaluation structure is hardly available for an ultra-large scale integration.

SUMMARY OF THE INVENTION

It is therefore an important object of the present invention to provide a method of evaluating a contact resistance which allows an analyst to quickly evaluate a large number of contacts.

To accomplish the object, the present invention proposes to selectively measure contact resistances of addressable evaluating cells.

In accordance with one aspect of the present invention, there is provided a method of evaluating a contact resistance, comprising the steps of: a) preparing a semiconductor device having a plurality of addressable evaluating cells each having a first impurity region, a second impurity region and a third impurity region respectively held in contact with a first conductive line, a second conductive line and a third conductive line for forming a first contact, a second contact and a third contact; b) selecting one of the plurality of addressable evaluating cells for evaluating the first contact; c) electrically connecting the first impurity region, the second impurity region and the third impurity region to one another; d) allowing a current to flow from the second conductive line through the second impurity region, the first impurity region and the first contact to the first conductive line, no current flowing from the first impurity region through the third impurity region and the third contact into the third conductive line; e) measuring a potential difference between the first conductive line and the third conductive line; f) calculating a resistance of the first contact on the basis of the current and the potential difference; g) selecting another of the plurality of addressable evaluating cells; and h) repeating the steps c), d), e) and f) for the aforesaid another of the plurality of addressable evaluating cells.

In accordance with another aspect of the present invention, there is provided a method of evaluating a contact resistance, comprising the steps of: a) preparing a semiconductor device having a plurality of contacts; b) selecting one of the plurality of contacts for evaluation; c) allowing a current to flow from one side of the aforesaid one of the contacts to the other side of the one of the contacts for measuring a potential difference therebetween; d) calculating the resistance of the aforesaid one of the contacts on the basis of the amount of the current and the potential difference; e) selecting another of the plurality of contacts for evaluation; and f) repeating the steps of c) and d) for the aforesaid another of the plurality of contacts.

BRIEF DESCRIPTION OF THE DRAWINGS

The features and advantages of the semiconductor device according to the present invention will be more clearly understood from the following description taken in conjunction with the accompanying drawings in which.

DESCRIPTION OF THE PREFERRED EMBODIMENTS

First Embodiment

Figure 1:
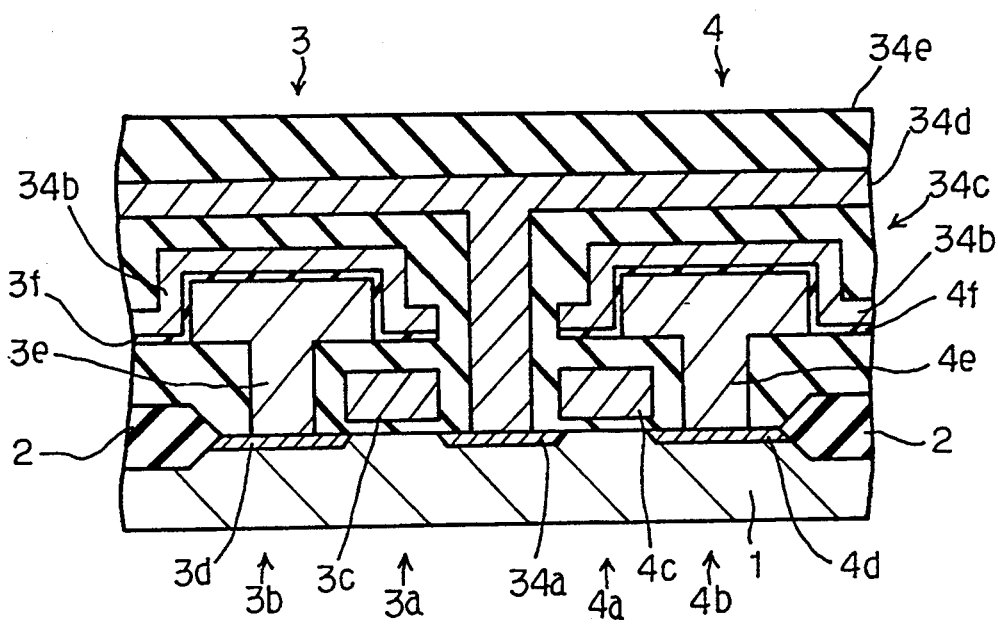
FIG. 1 is a cross sectional view showing the structure of the prior art dynamic random access memory cells.
Figure 2:
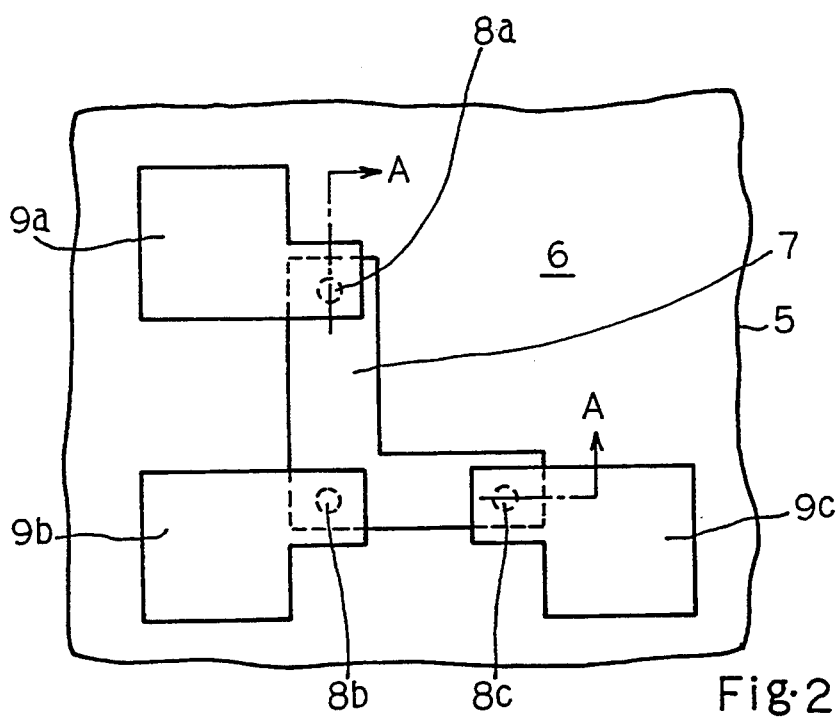
FIG. 2 is a plan view showing the layout of the prior art semiconductor device available for the evaluation for the contact resistance.
Figure 3:
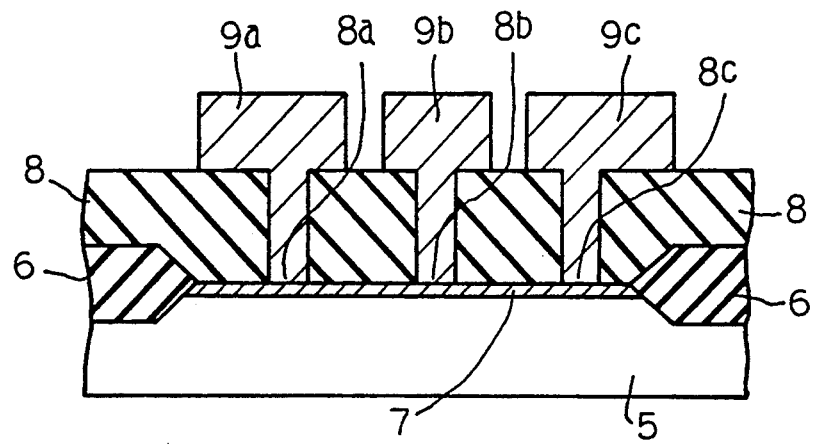
FIG. 3 is a cross sectional view taken along line A—A of FIG. 2 and showing the structure thereof.
Figure 4:
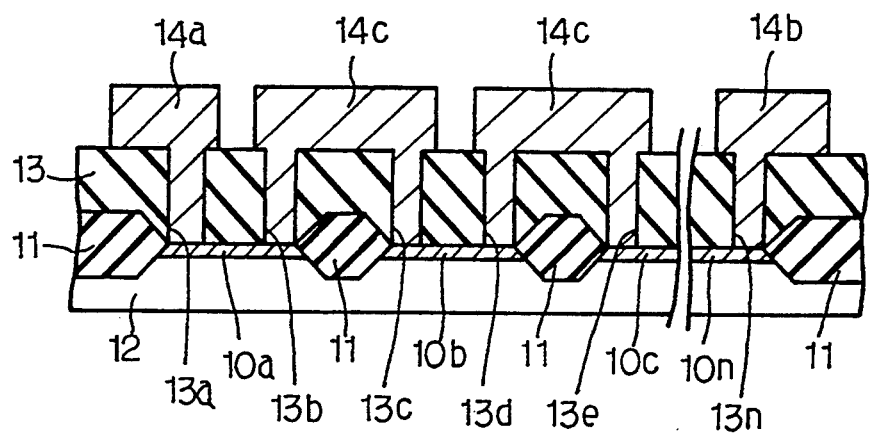
FIG. 4 is a cross sectional view showing the structure of the second prior art semiconductor device available for the evaluation for the contact resistances.
Figure 5:
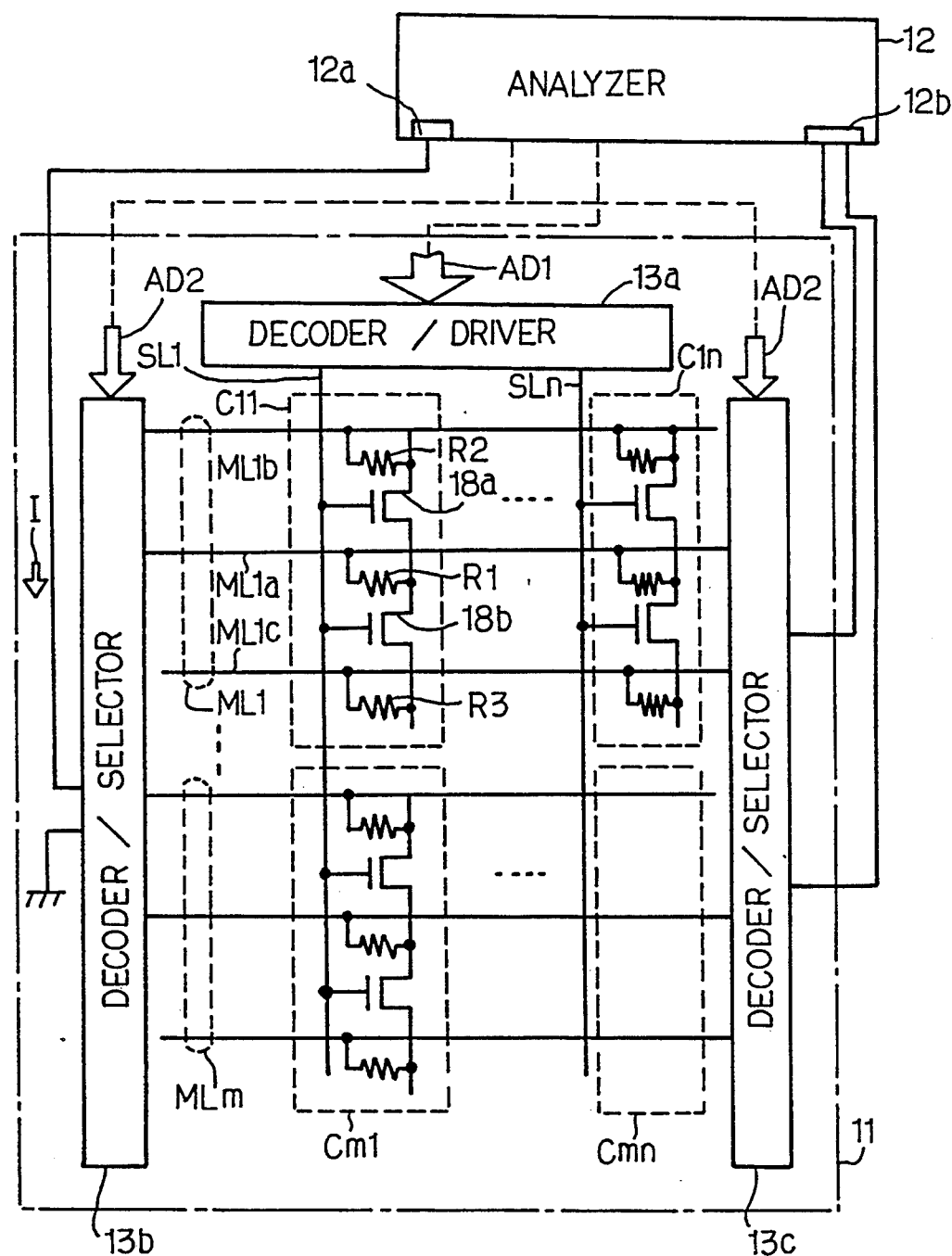
FIG. 5 is a circuit diagram showing the arrangement of an evaluating circuit according to the present invention.

Referring to FIG. 5 of the drawings, an evaluating circuit for contact resistances embodying the present invention is fabricated on a p-type single semiconductor substrate 11, and is coupled with an analyzer 12. The evaluating circuit largely comprises a plurality of evaluating cells C11, . . . , C1n, . . . , Cm1, . . . and Cmn arranged in rows and columns, a plurality of selecting lines SL1, . . . and SLn for selecting a column of the evaluating cells C11, . . . Cm1/ . . . /C1n, . . . Cmn, a decoder/driver unit 13a responsive to a first address signal AD1 indicative of one of the columns of evaluating cells C11 . . . Cm1/C1n . . . Cmn for energizing the associated selecting lines SL1 to SLn, a plurality sets of monitoring lines ML1 to MLm for selecting a row of the evaluating cells C11 . . . C1n/Cm1 . . . Cmn, a first decoder/selector unit 13b responsive to a second address signal AD2 indicative of one of the rows of evaluating cells for selectively coupling a current source 12a of the analyzer 12 with the plurality sets of monitoring lines ML1 to MLm and a second decoder/selector unit 13c also responsive to the second address signal AD2 for selectively coupling the set of monitoring lines with a data input buffer 12b of the analyzer 12.

Figure 6:
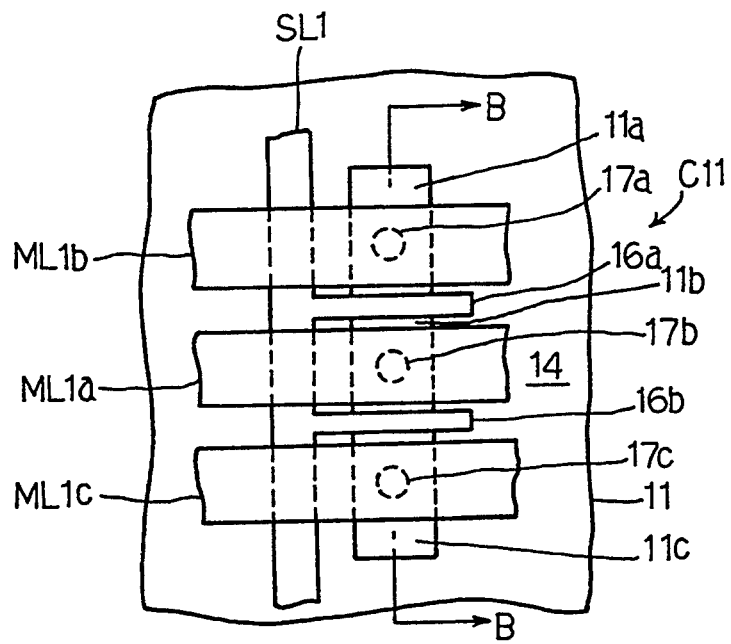
FIG. 6 is a plan view showing the layout of each evaluating cell incorporated in the evaluating circuit.
Figure 7:
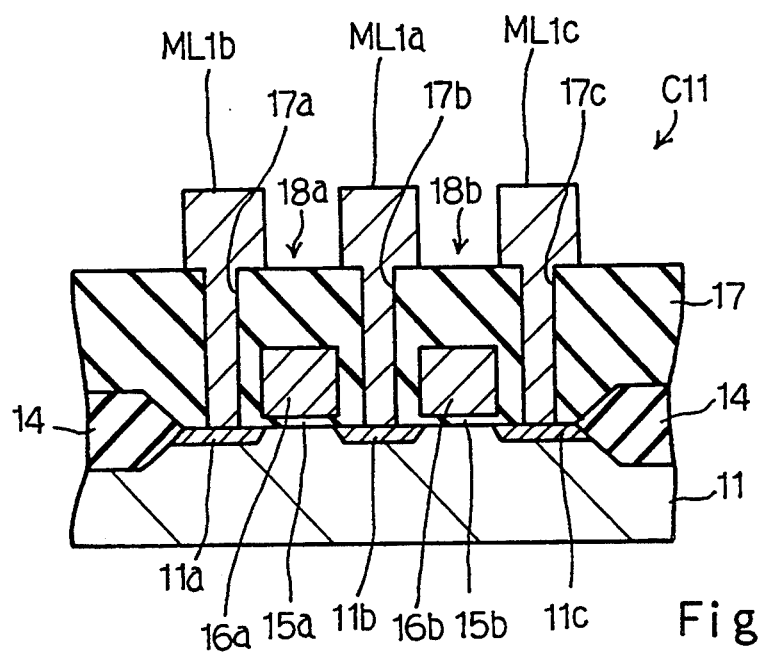
FIG. 7 is a cross sectional view taken along lines B—B of FIG. 6 and showing the structure of the evaluating cell.

The evaluating cells C11 to Cmn are similar to one another, and the evaluating cell C11 is, by way of example, illustrated in FIGS. 6 and 7. On the semiconductor substrate 11 is grown a thick field oxide layer 14 which defines an active region assigned to the evaluating cell C11, and a local oxidation of silicon technique may be used for the thick field oxide layer 14. Three impurity regions 11a, 11b and 11c are formed in the active region at intervals, and thin gate oxide films 15a and 15b are grown on channel regions between the n-type impurity regions 11a and 11b and between the n-type impurity regions 11b and 11c, respectively. Gate electrodes 16a and 16b are provided on the thin gate oxide films 15a and 15b, respectively, and the gate electrodes 16a and 16b are electrically connected to the associated selecting line SL1. The gate electrodes 16a and 16b are covered with an inter-level insulating layer 17, and contact holes 17a, 17b and 17c formed in the inter-level insulating layer 17 for exposing the impurity regions 11a, 11b and 11c. The associated set of monitoring lines ML1 is implemented by three conductive lines, i.e., a charging line ML1a, a discharging line ML1b and a voltage line ML1c, and are held in contact through the contact holes 17b, 17a and 17c with the impurity regions 11b, 11a and 11c, respectively. The inter-level insulating layer 17 is removed from FIG. 6 for clearly showing the layout of the evaluating cell C11.

The impurity regions 11a and 11b, the gate oxide film 15a and the gate electrode 16a form in combination a first switching element 18a, and the impurity regions 11b and 11c, the gate oxide film 15b and the gate electrode 16b as a whole constitute a second switching element 18b. Contact resistances R1, R2 and R3 take place between the impurity regions 11b, 11a and 11c and the charge/discharge/voltage lines ML1a, ML1b and ML1c, respectively.

The first decoder/selector unit 13b is coupled with the charging and discharging lines of each set of monitoring lines, and supplies the current I to the charging line ML1a of a selected set, and discharges the current on the discharging line ML1b to the ground.

On the other hand, the second decoder/selector unit 13c transfers the potential difference between the charging line ML1a and the voltage line ML1c. When the second switching element 18b turns on, the voltage line ML1c is equal in potential level to the impurity region 11b, because current does not flow through the voltage line ML1c.

If the evaluation circuit is designed under 1-micron design rules, each evaluation cell occupies a real estate of 6 microns by 11 microns, and $10^6$ evaluating cells occupy only 66 square millimeter. Although the decoder/driver unit 13a and the decoder/selector units 13b and 13c consume additional real estate, the evaluation circuit according to the present invention is feasible on the single semiconductor substrate 11.

Figure 8:
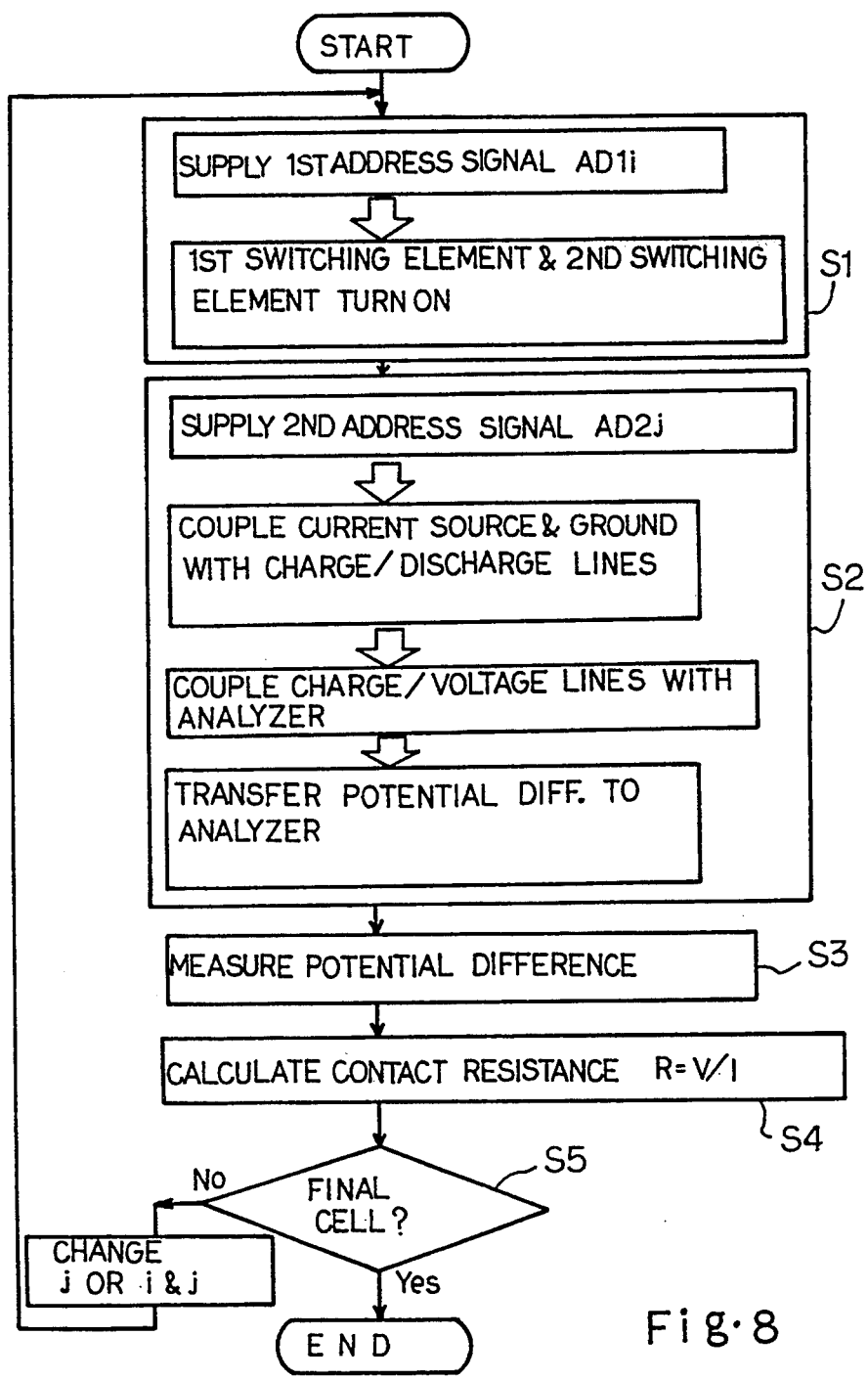
FIG. 8 is a flow chart showing an evaluating sequence executed by an analyzer coupled with the evaluating circuit shown in FIG. 5.

Description is hereinbelow made on an evaluating sequence with reference to FIG. 8. The evaluating circuit is fabricated on the semiconductor substrate through a process sequence which an analyst is requested to evaluate. Upon completion of the process sequence, the evaluation circuit is appropriately coupled with the analyzer 12, and the evaluating sequence starts. The evaluating cells C11 is assumed to be subjected to the evaluation.

The analyzer 12 firstly supplies the first address signal AD1 indicative of the first column of evaluating cells C11 to Cm1 to the decoder/driver unit 13a as by step S1, and the decoder/driver unit 13a energizes the selecting line SL1 to an active level. Then, the first and second switching elements 18a and 18b of the evaluating cells C11 to Cm1 turn on, and the impurity region 11b is electrically connected through the channel regions with the associated impurity regions 11a and 11c. In the flow chart, AD1$i$ is indicative of the first address signal AD1 indicative of the ith column of evaluating cells, and i is changed from 1 to n.

Subsequently, the analyzer 12 supplies the second address signal AD2 indicative of the row of evaluating cells C11 to C1n as by step S2. AD2$j$ is indicative of the second address signal AD2 indicative of the jth row of evaluating cells, and j is changed from 1 to m. The first decoder/selector unit 13b is responsive to the second address signal AD21, and couples the current source 12a and the ground with the charging line ML1a and the discharging line ML1b of the selected set of monitoring lines ML1. The current I flows through the first switching element 18a, and is discharged from the discharging line ML1b to the ground.

The second decoder/selector unit 13c is also responsive to the second address signal AD21, and couples the charging line ML1a and the voltage line ML1c with the input buffer 12b of the analyzer 12. The voltage line ML1c is in floating state, and no current flows therethrough. For this reason, the voltage level on the line ML1c is equal to the voltage level at the impurity region 11b, and the potential difference V between the charging line ML1a and the voltage line ML1c is caused by the contact resistance R1. The potential difference V is relayed to the input buffer 12b.

The analyzer 12 fetches a data indicative of the potential difference V stored in the input buffer 12b, and determines the magnitude of the potential difference V as by step S3.

The analyzer 12 divides the potential difference V by the current I, and determines the contact resistance R1 as by step S4. The contact resistance thus determined is output or stored in a memory incorporated in the analyzer 12.

Then, the analyzer 12 proceeds to step S5, and checks the first and second address signals AD1 and AD2 to see whether or not the final evaluation cell Cmn has been evaluated. While the answer is given negative, the analyzer 12 changes the second address signal AD2$j$ or both first and second address signals AD1$i$ and AD2$j$, and repeats the loop consisting of steps S1 to S5.

When all of the evaluating cells C11 to Cmn are evaluated, the answer at step S5 is given affirmative, and the analyzer terminates the evaluating sequence.

If the load capacitance and the load resistance are about 10 pF and 100 kilo-ohms, the evaluation loop for each cell is completed within 1 micro-second, and $10^6$ cells are evaluated within only 1 second.

As will be appreciated from the foregoing description, the evaluating circuit allows an analyzer to analyze a large number of contacts within short time period.

Second Embodiment

Figure 9:
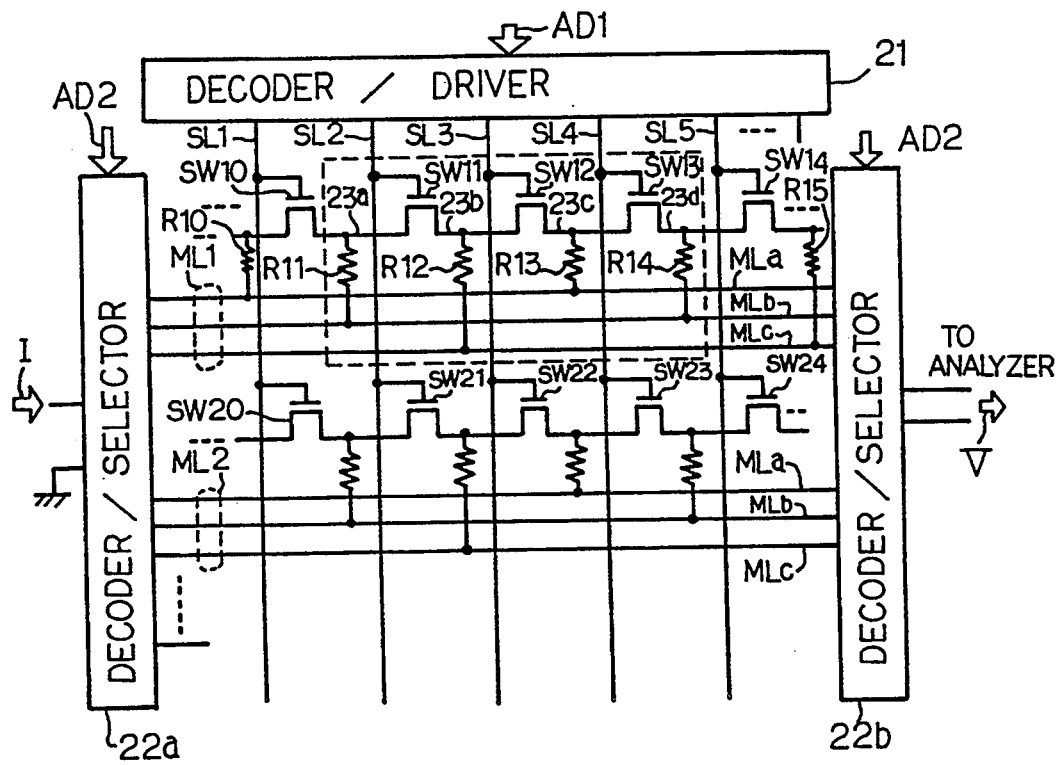
FIG. 9 is a circuit diagram showing another evaluating circuit according to the present invention.
Figure 10:
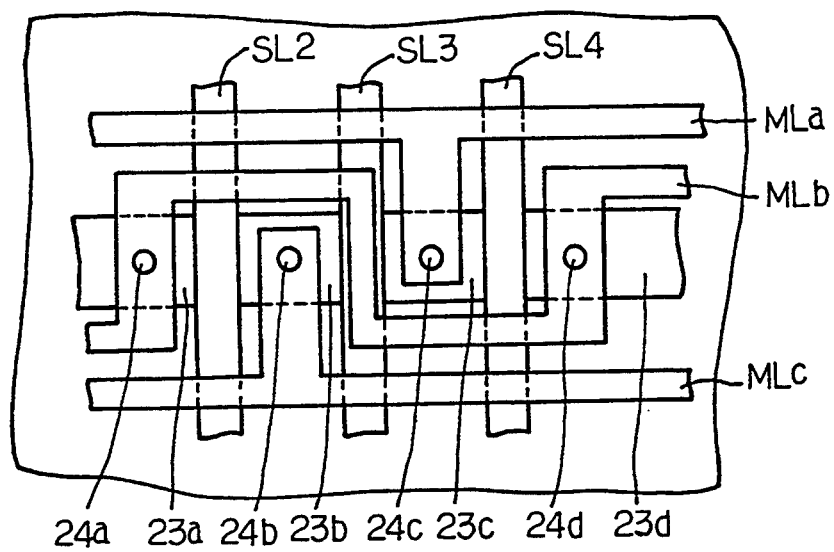
FIG. 10 is a plan view showing the layout of a part of an evaluating cell array incorporated in the evaluating circuit shown in FIG. 9.

Turning to FIGS. 9 and 10 of the drawings, another evaluating circuit embodying the present invention largely comprises rows of switching transistors SW10/SW11/SW12/SW13/SW14, SW20/SW21/SW22/SW23/SW24 ..., a plurality of selecting lines SL1, SL2, SL3, SL4, ... and a plurality sets ML1, ML2, ... of monitoring lines MLa/MLb/MLc associated with the rows of switching transistors, a decoder/driver unit 21 responsive to a first address signal AD1 for selectively energizing the selecting lines SL1, SL2, SL3, SL4, ..., a first decoder/selector unit 22a responsive to a second address signal AD2 for selectively coupling a source of current I and a ground line with two of selected set of monitoring lines MLa/MLb/MLc, and a second decoder/selector unit 22b also responsive to the second address signal AD2 for transferring a potential difference on two of the selected set of monitoring lines to an analyzer. Each of the row of switching transistors SW10, SW11, SW12, SW13, SW14, ... are coupled in series, and are respectively gated by the selecting lines SL1, SL2, SL3, SL4, SL5 ....

FIG. 10 illustrates the layout of the three switching transistors SW11, SW12, SW13 enclosed by broken lines in FIG. 9. Impurity regions 23a, 23b, 23c and 23d are incorporated in the three switching transistors SW11 to SW13, and are held in contact with the associated set ML1 of monitoring lines MLa/MLb/MLc through contact holes 24a/24b/24c/24d formed in an inter-level insulating layer (not shown) over the impurity regions 23a to 23d. The contact resistances between the impurity regions 23a to 23d and the monitoring lines MLa to MLc are represented by the symbol of resistor labeled with R11, R12, R13, R14 respectively.

Assuming now that the contact resistance R12 is targeted for the evaluation, the first address signal AD1 indicative of the selecting lines SL2/SL3 is, first, supplied to the decoder/driver unit 21, and the decoder/driver unit 21 energizes the selecting lines SL2/SL3. The switching elements SW11 and SW12 turn on, and electrically interconnect the impurity regions 23a, 23b and 23c.

Subsequently, the first decoder/selector unit 22a couples the source of current I and the ground line with the monitoring lines MLc and MLb of the set ML1. Then, the current I flows from the monitoring line MLc through the contact 24b and impurity regions 23b and 23a to the monitoring line MLb. The second decoder/selector unit 22b is also responsive to the second address signal AD2 for transferring a potential difference V between the monitoring lines MLc and MLa to an analyzer. The potential difference V takes place due to the contact resistance R12, and the contact resistance R12 is given by dividing the potential difference V by the current I.

The first address signal AD1 is changed so that the decoder/selector unit 21 energizes the selecting lines SL3 and SL4. Then, the switching elements SW12 and SW13 turn on, and the impurity regions 23b, 23c and 23d are electrically connected with one another.

The first decoder/selector unit 22a couples the source of current I and the ground line with the monitoring line MLa and MLc, and the current I flows from the monitoring line MLa through the contact 24c and the impurity regions 23c and 23b to the monitoring line MLc. The second decoder/selector unit 22b transfers the potential difference between the monitoring lines MLa and MLb to the analyzer, and the contact resistance R13 is given as R13=V/I.

Thus, the decoder/driver unit 21 sequentially selecting two selecting lines SL1, SL2, SL3, SL4, SL5, ..., and the first and second decoder/selectors units 22a and 22b appropriately select the monitoring lines of the associated set. As, a result, all of the contact resistances are measured for evaluation.

If the evaluating circuit implementing the second embodiment is designed under the 1-micron design rules, each transistor occupies a small area of 5 microns by 11 microns, and $10^6$ contacts are realized on 55 square-millimeters.

In a modification of the second embodiment, the contact resistances R11, R12, R13 and R14 are sequentially evaluated as follows. The impurity region on the left side of the switching transistor SW10 is assumed to be coupled to the monitoring line MLa for forming a contact referred to as "contact resistance R10". Moreover, the impurity region on the right side of the switching transistor SW14 is assumed to be coupled to the monitoring line MLc for forming a contact referred to as "contact resistance R15".

In order to evaluate the contact resistance R11, the decoder/driver 21 energizes the selecting lines SL1 and SL2, and allows the switching transistors SW10 and SW11 to turn on. The decoder/selector 22a couples the monitoring lines MLa and MLb to the source of current and the ground line, and, accordingly, current I flows from the monitoring line MLa through the switching transistor SW10 and the contact resistance R11 to the monitoring line MLb. On the other hand, the decoder/selector 22b couples the monitoring lines MLb and MLc to the analyzer, and the contact resistance R11 is calculated by dividing the potential difference between the monitoring lines MLb and MLc by the current I passing through the contact resistance R11.

Subsequently, the decoder/driver 21 energizes the selecting lines SL2 and SL3, and allows the switching transistors SW11 and SW12 to turn on. The decoder/selector 22a couples the monitoring lines MLb and MLc to the source of current and the ground line, and, accordingly, current I flows from the monitoring line MLb through the switching transistor SW11 and the contact resistance R12 to the monitoring line MLc. On the other hand, the decoder/selector 22b couples the monitoring lines MLc and MLa to the analyzer, and the contact resistance R12 is calculated by dividing the potential difference between the monitoring lines MLc and MLa by the current I passing through the contact resistance R12.

Subsequently, the decoder/driver 21 energizes the selecting lines SL3 and SL4, and allows the switching transistors SW12 and SW13 to turn on. The decoder/selector 22a couples the monitoring lines MLc and MLa to the source of current and the ground line, and, accordingly, current I flows from the monitoring line MLc through the switching transistor SW12 and the contact resistance R13 to the monitoring line MLa. On the other hand, the decoder/selector 22b couples the monitoring lines MLa and MLb to the analyzer, and the contact resistance R13 is calculated by dividing the potential difference between the monitoring lines MLa and MLb by the current I passing through the contact resistance R13.

Subsequently, the decoder/driver 21 energizes the selecting lines SL4 and SL5, and allows the switching transistors SW13 and SW14 to turn on. The decoder/selector 22a couples the monitoring lines MLa and MLb to the source of current and the ground line, and, accordingly, current I flows from the monitoring line MLa through the switching transistor SW13 and the contact resistance R14 to the monitoring line MLb. On the other hand, the decoder/selector 22b couples the monitoring lines MLb and MLc to the analyzer, and the contact resistance R14 is calculated by dividing the potential difference between the monitoring lines MLb and MLc by the current I passing through the contact resistance R14.

Thus, the decoder/driver 21 and the decoder/selectors 22a and 22b sequentially selects the selecting lines SL1 to SL5, . . . and the monitoring lines MLa/MLb/MLc for evaluating all of the contact resistances except for the leftmost and the rightmost contact resistances. When the contact resistances associated with a set ML1 of monitoring lines MLa/MLb/MLc are evaluated, the decoder/driver 21 repeats the sequential selection on the selecting lines SL1 to SL5, . . . , and the decoder/selectors 22a and 22b selectively couple the monitoring lines MLa/MLb/MLc of the next set ML2 to the source of current, the ground line and the analyzer.

In this modification, there is no concept of "cell", and the analyzer can evaluate most of the contact resistances formed on a semiconductor substrate.

Third Embodiment

Figure 11:
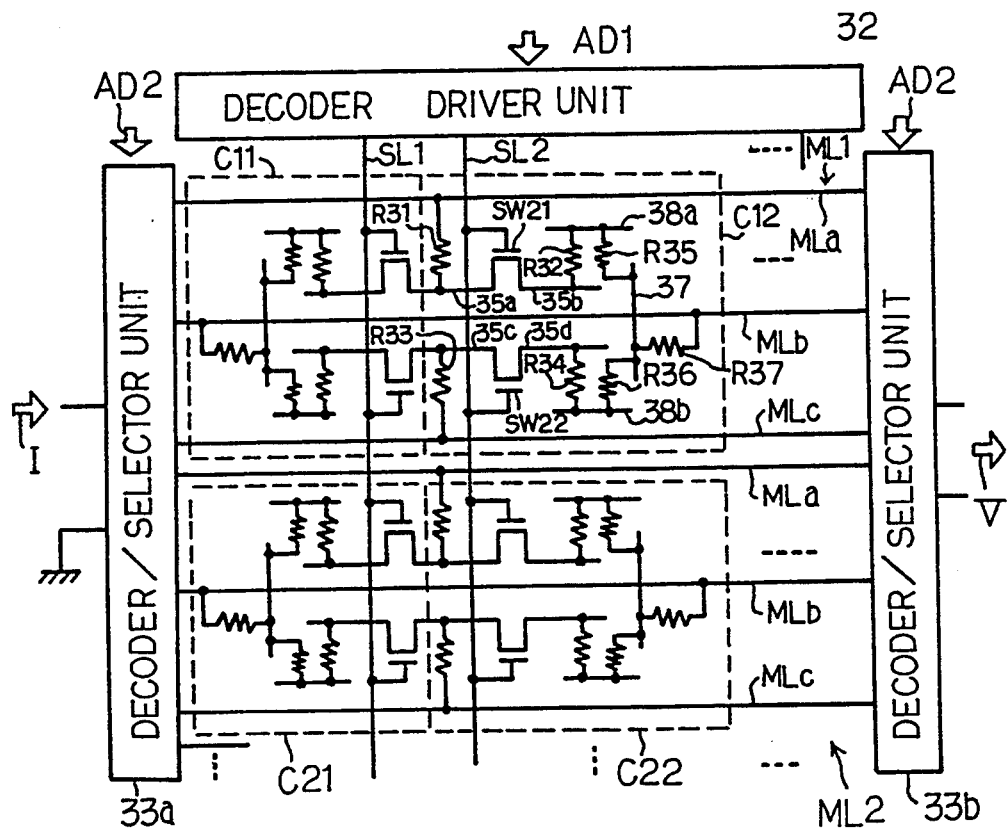
FIG. 11 is a circuit diagram showing yet another evaluating circuit according to the present invention.

Turning to FIG. 11 of the drawings, yet another evaluating circuit embodying the present invention is fabricated on a semiconductor substrate 31, and comprises an array of evaluating cells C11, C12, . . . , C21, C22, . . . , a plurality of selecting lines SL1, SL2, . . . respectively associated with the columns of evaluating cells, a plurality sets ML1, ML2, . . . of monitoring lines MLa/MLb/MLc respectively associated with the rows of evaluating cells, a decoder/driver unit 32 responsive to a first address signal AD1 for selectively energizing the selecting lines SL1, SL2, . . . , a first decoder/selector unit 33a responsive to a second address signal AD2 for coupling a source of current I and a ground line with two monitoring lines MLa/MLb of a selected set and a second decoder/selector unit 33b responsive to the second address signal AD2 for transferring a potential difference between two monitoring lines MLb/MLc of the selected set.

Figure 12:
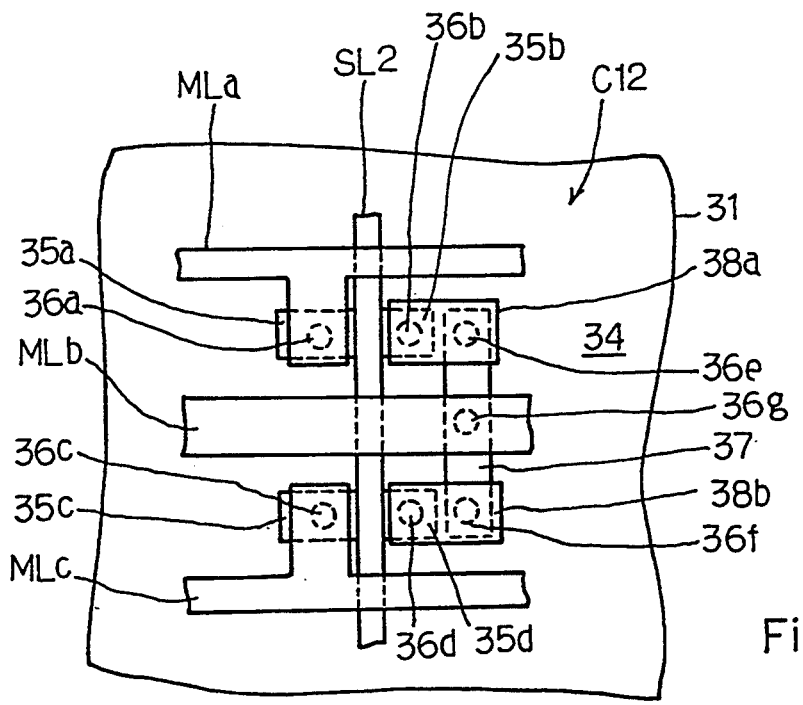
FIG. 12 is a plan view showing the layout of a part of an evaluating cell array incorporated in the evaluating circuit shown in FIG. 11.

All of the evaluating cells C11, C12, C21, C22, . . . are similar in arrangement, and the layout of the evaluating cell C12 is illustrated in detail in FIG. 12. A thick field oxide layer 34 defines a plurality of active areas, and two active areas are assigned to the evaluating cell C12. Two pairs of impurity regions 35a/35b and 35c/35d are formed in the active areas, and channel regions separates the impurity regions 35a and 35c from the impurity regions 35b and 35d, respectively. The associated selecting line SL2 pass over gate insulating films on the channel regions, and partially serves as two switching elements SW21 and SW22. An interconnection 37 is patterned on the thick field oxide layer 34.

Though not shown in FIG. 12, an inter-level insulating layer covers the impurity regions 35a/35b/35c/35d, the selecting line SL2 and the interconnection 37, and contact holes 36a, 36b, 36c, 36d, 36e, 36f and 36g are formed in the inter-level insulating layer for exposing the impurity regions 35a/35b/35c/35d, both ends of the interconnection 37 and an intermediate portion of the interconnection 37. The monitoring lines MLa and MLc and interconnections 38a and 38b are held in contact through the contact holes 36a/36b/36c/36d with the impurity regions 35a/35b/35c/35d, respectively, and the interconnections 38a and 38b are held in contact through the contact holes 36e and 36f with both end of the interconnection 37. The contact hole 36g allows the monitoring line MLb to contact through the contact hole 36g with the intermediate portion of the interconnection 37. For this reason, contact resistances R31, R32, R33, R34, R35, R36 and R37 take place in the evaluating cell C12 against current flowing therethrough.

Assuming now that the evaluating cell C12 is selected in an evaluation sequence, the first address signal AD1 causes the decoder/driver unit 32 to energize the selecting line SL2, and the switching elements SW21 and SW22 electrically connect the impurity regions 35a and 35c with the impurity regions 35b and 35d, respectively.

Subsequently, the second address signal AD2 causes the first decoder/selector unit 33a to couple the monitoring lines MLb and MLa of the set ML1 with the source of current I and the ground line, respectively. The current flows from the monitoring line MLa through the contact resistance R31, the impurity regions 35a and 35b, the contact resistance R32, the interconnection 38a, the contact resistance R35, the interconnection 37 and the contact resistance R37 into the monitoring line MLb.

On the other hand, the second decoder/selector unit 33b transfers a potential difference V between the monitoring lines MLb and MLc to an analyzer (not shown), and the potential difference is produced due to the contact resistance R37. Then, the contact resistance R37 is given as R37=V/I.

Thus, the contact resistances at the interconnections 37 are measurable by using the evaluating cells implementing the third embodiment, and the evaluation consumes time period approximately equal to the first embodiment. If the evaluating circuit of the third embodiment is designed under the 1-micron design rules, each evaluating cell occupies narrow real estate of 6.5 micron $\times$ 13 micron, and $10^6$ evaluating cells are integrated on 85 square millimeters. All of the contacts incorporated therein are $7 \times 10^6$.

Although particular embodiments of the present invention have been shown and described, it will be obvious to those skilled in the art that various changes and modifications may be made without departing from the spirit and scope of the present invention. For example, p-type impurity regions 11a, 11b and 11c may be formed in an n-type semiconductor substrate 11.

What is claimed is:

1. A method of evaluating a contact resistance, comprising the steps of:
 a) preparing a semiconductor device having a plurality of addressable evaluating cells each having a first impurity region, a second impurity region and a third impurity region respectively held in contact with a first conductive line, a second conductive line and a third conductive line for forming a first contact, a second contact and a third contact, said plurality of evaluating cells being equal in dimensions to one another, said first, second and third contacts of one of said plurality of evaluating cells being identical with those of another of said plurality of evaluating cells;
 b) selecting one of said plurality of addressable evaluating cells for evaluating said first contact;

c) electrically connecting said first impurity region, said second impurity region and said third impurity region to one another;

d) allowing a current to flow from said second conductive line through said second impurity region, said first impurity region and said first contact to said first conductive line, no current flowing from said first impurity region through said third impurity region and said third contact into said third conductive line;

e) measuring a potential difference between said first conductive line and said third conductive line;

f) calculating a resistance of said first contact on the basis of said current and said potential difference;

g) selecting another of said plurality of addressable evaluating cells; and h) repeating said steps c), d), e) and f) for said another of said plurality of addressable evaluating cells.

2. A method of evaluating a contact resistance, comprising the ordered steps of:

a) preparing a semiconductor device having a plurality of addressable evaluating cells each having a first impurity region held in contact with a first conductive line for forming a first contact, a second impurity region held in contact with a second conductive line for forming a second contact, a third impurity region held in contact with a third conductive line for forming a third contact, and a fourth impurity region coupled with said second conductive line for forming a fourth contact;

b) selecting one of said plurality of addressable evaluating cells for evaluating said first contact;

c) electrically connecting said first impurity region, said second impurity region and said third impurity region to one another;

d) allowing a current to flow from said second conductive line through said second impurity region, said first impurity region and said first contact to said first conductive line, no current flowing from said first impurity region through said third impurity region and said third contact into said third conductive line;

e) measuring a potential difference between said first conductive line and said third conductive line;

f) calculating a resistance of said first contact on the basis of said current and said potential difference;

f-1) electrically connecting said first impurity region, said third impurity region and said fourth impurity region to one another, f-2) allowing a current to flow from said second conductive line through said fourth impurity region, said third impurity region and said third contact to said third conductive line, no current flowing from said third impurity region through said first impurity region and said first contact into said first conductive line, f-3) measuring a potential difference between said first conductive line and said third conductive line;

f-4) calculating a resistance of said first contact on the basis of said current and said potential difference;

g) selecting another of said plurality of addressable evaluating cells; and h) repeating said steps c), d), e), f), f-1), f-2), f-3) and f-4) for said another of said plurality of addressable evaluating cells.

3. A method of evaluating a contact resistance, comprising the steps of:

a) preparing a semiconductor device having a plurality of addressable evaluating cells each having a first impurity region, a second impurity region and a third impurity region respectively held in contact with a first conductive line, a second conductive line and a third conductive line for forming a first contact, a second contact and a third contact, said first impurity region having a first sub-impurity region and a second sub-impurity region spaced apart from one another, said first sub-impurity region and said second sub-impurity region being coupled with a first intermediate conductive line and a second intermediate conductive line for forming a first intermediate contact and a second intermediate contact, said first intermediate conductive line and said second intermediate conductive line being coupled with a third intermediate conductive line at spacing for forming a third intermediate contact and a fourth intermediate contact, said third intermediate conductive line being coupled with said first conductive line for forming said first contact;

b) selecting one of said plurality of addressable evaluating cells for evaluating said first contact;

c) electrically connecting said first impurity region, said second impurity region and said third impurity region to one another;

d) allowing a current to flow from said second conductive line through said second impurity region, said first impurity region and said first contact to said first conductive line, no current flowing from said first impurity region through said third impurity region and said third contact into said third conductive line;

e) measuring a potential difference between said first conductive line and said third conductive line;

f) calculating a resistance of said first contact on the basis of said current and said potential difference;

g) selecting another of said plurality of addressable evaluating cells; and h) repeating said steps c), d), e) and f) for said another of said plurality of addressable evaluating cells.

4. A method of evaluating a contact resistance, comprising the steps of:

a) preparing a semiconductor device having a plurality of contacts identical with one another;

b) selecting one of said plurality of contacts for evaluation;

c) allowing a current to flow from one side of said one of said contacts to the other side of said one of said contacts for measuring a potential difference therebetween;

d) calculating the resistance of said one of said contacts on the basis of the amount of said current and said potential difference;

e) selecting another of said plurality of contacts for evaluation; and f) repeating steps c) and d) for said another of said plurality of contacts.

5. The method as set forth in claim 4, in which common source and drain regions of a plurality of field effect transistors are arranged in rows and columns for forming said plurality of contacts together with monitoring lines used for charge and discharge of said current and the measurement of said potential difference.

6. The method as set forth in claim 5, in which two of said plurality of field effect transistors simultaneously turn on for selecting one of said contacts in each of said steps b) and e).

7. The method as set forth in claim 6, in which said current flows through one of said two field effect transistors in said step c), and said potential difference is measured between said common source and drain regions of the other of said two field effect transistors.

* * * * *